United States Patent [19]

Svenson et al.

[11] Patent Number: 4,669,029

[45] Date of Patent: May 26, 1987

[54] ON AND UNDER COUNTER HOUSING FOR ELECTRICAL COMPONENTS

[75] Inventors: Richard N. Svenson, Livonia; Thomas S. Hicks, Westland; Thomas N. Good, Lincoln Park, all of Mich.

[73] Assignee: Burroughs Corporation, Detroit, Mich.

[21] Appl. No.: 791,194

[22] Filed: Oct. 25, 1985

[51] Int. Cl.$^4$ .............................................. H05K 7/00
[52] U.S. Cl. .....................................361/392; 73/431; 177/143; 177/244; 361/331
[58] Field of Search .................. 73/431; 177/143, 244; 248/27.1; 340/666; 346/145; 361/331, 380, 391, 393–394, 398, 399, 429

[56] References Cited

U.S. PATENT DOCUMENTS 2,858,124 10/1958 Allen et al. .......................... 177/144
4,582,151 4/1986 Mairot et al. ........................ 177/244

FOREIGN PATENT DOCUMENTS 2209858 4/1973 Fed. Rep. of Germany ...... 361/391

Primary Examiner—A. D. Pellinen
Assistant Examiner—Gregory P. Thompson
Attorney, Agent, or Firm—Mark T. Starr

[57] ABSTRACT

The present disclosure describes a housing module characterized in that it may be readily slid onto a counter-like unit which provides support therefor. The module finds particular application in the housing of electrical components, wherein the latter may be located either in a tray-like section disposed on the surface of the counter-like unit or in a box-like enclosure, below the unit. The components are electrically connected and communicate with one another via cables which are routed within the module and which may be pre-wired, thereby eliminating cable through-holes in the unit.

10 Claims, 3 Drawing Figures

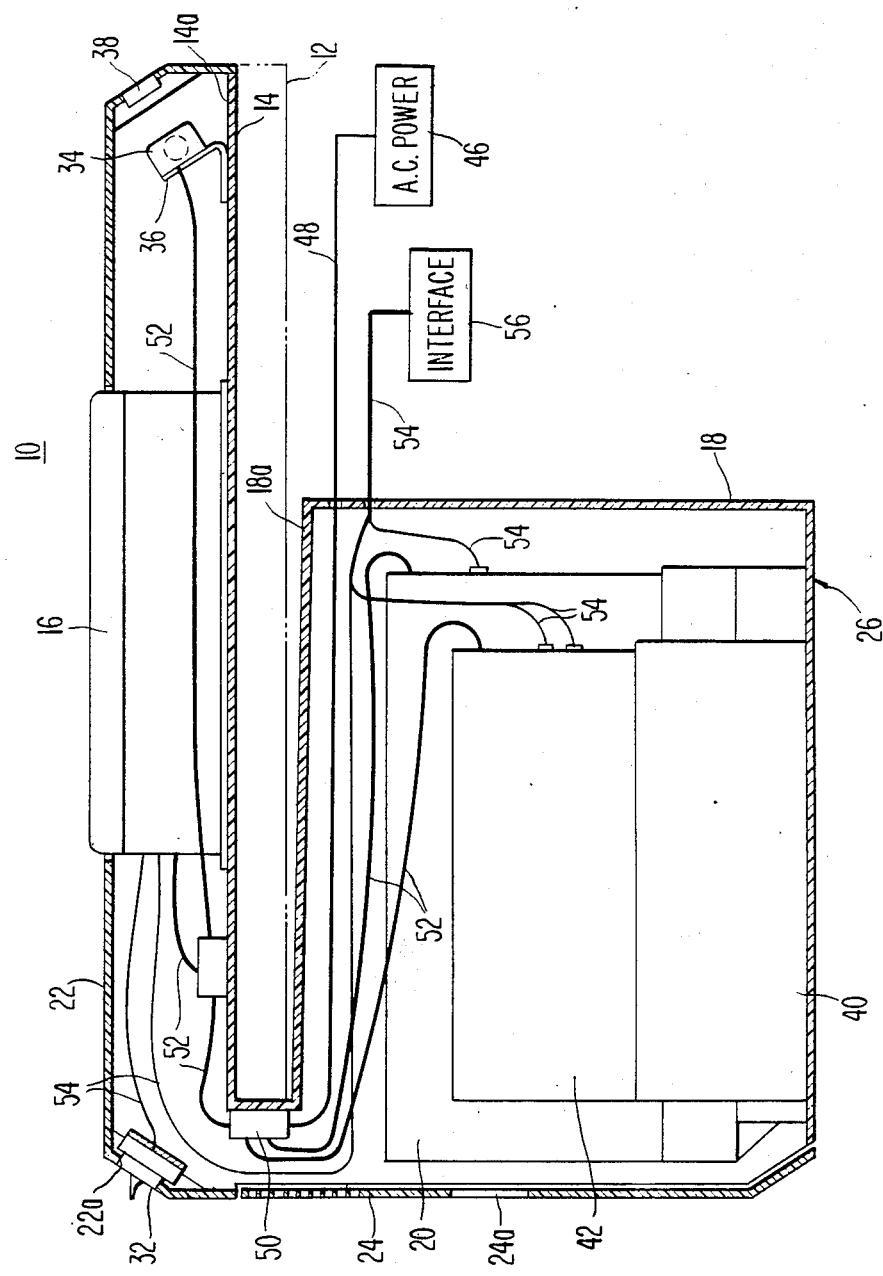

ON AND UNDER COUNTER HOUSING FOR ELECTRICAL COMPONENTS

BACKGROUND OF THE INVENTION

In a customer service environment, where a number of electrical and electronic components are utilized in the course of a transaction, difficulty arises in the placement and interconnection of such components relative to the service counter. The foregoing is particularly evident when an existing counter is to be retrofitted to accept such components.

For example, in the proposed updating of the window clerk workstation presently used by the U.S. Postal Service, a problem exists in the placement of components such as respective dual CRT displays for the clerk and customer, a load cell or scale for weighing mail pieces, meter strip and customer receipt printers and a central processing unit. Obviously, insufficient area exists on the counter top to accommodate all of the required components. Additionally, assuming that the components could be mounted on the counter, substantially large holes would have to be drilled in the counter to permit the passage of power and communication cables therethrough. Since each component generally requires at least a power cable and a pair of communication cables, it is apparent that the underside of the counter will be cluttered with a mass of cable connections. Another significant factor is that the installation of such components is both costly and time consuming—requiring the services of a carpenter, an electrician and a computer technician. Considering the Postal Service application alone, approximately 35,000 locations with an average of three window clerk workstations at each location would require updating.

A need exists for a modular electrical equipment housing which may be easily and quickly installed preferably by one person on an existing counter, without the need for altering the counter top. The modular housing of the present invention which comprises a pre-wired integral unit and which slides onto and under a counter fills such a need.

SUMMARY OF THE INVENTION

In accordance with the present invention, there is provided at least one housing module comprised of a base structure, a cover and an access door. The base structure, which is preferably formed as an integral unit, includes a tray-like section, a box-like enclosure open on one side, and support members joining the section and enclosure to each other. The bottom of the tray-like section and the top of the box-like enclosure are disposed in respective substantially parallel planes, displaced from each other to create a slot therebetween.

It will be assumed for purposes of example that the housing module is to be mounted on the typical Postal Service counter, having sides identified respectively as the "customer side" and the "clerk side". It should be understood that the invention is not limited to this particular application. The aforementioned slot permits the module to be slid onto the counter from the clerk side—the width of the slot being chosen to accommodate the thickness of the counter. After installation, the tray-like section of the housing module lies upon the upper surface of the counter and extends transverse to the longitudinal axis of the latter. The box-like enclosure, with its opening directed toward the clerk side, is located under the counter, below the tray-like section.

Both the tray-like section and the box-like enclosure contain electrical/electronic components which are connected by cables to a source of electrical power and which cooperate with one another over communication cables. For example, in an actual operative module, a load cell or scale is mounted within the tray-like section on the counter top for weighing mail pieces and the meter postage printer and a central processing unit are housed in the box-like enclosure under the counter. Both the power and communication cables in the tray-like section are routed over the edge of the counter on the clerk side and are directed toward the rear of the box-like enclosure where they are grouped with other power and communication cables originating in the last mentioned enclosure. Thus, the housing module may be prewired since no cable openings are required in the counter. Additionally, the components to be housed within the module may be placed therein either before or after the module is suspended from the counter. Finally, an installation cover is placed over the tray-like section, and a door over the opening in the box-like enclosure, to help protect the equipment.

It should be observed that while a single housing module has been described, a module system may include a plurality of modules which communicate with one another. For instance, in the Postal Service environment chosen for purposes of example, a second module may be installed on the counter, spaced apart from the first module. The second module may include, in place of the load cell, a pair of CRT displays oriented respectively toward the clerk and the customer. The entire transaction is thus apparent as the clerk enters information into the system via a keyboard. The box-like enclosure of the second module might include a customer receipt printer. Thus, the basic structure of the two modules is the same but minor modifications are required to accommodate the different component configurations.

The housing module of the present invention provides an efficient, space-saving, cost-effective solution to the problem of placement of electrical components relative to a counter, table or the like. Other features and advantages of the invention will become more fully apparent in the detailed description of the housing which follows.

BRIEF DESCRIPTION OF THE DRAWING

FIG. 3 is a section view of the module of FIG. 2 illustrating the routing of the power and communication cables servicing the components.

DESCRIPTION OF THE PREFERRED EMBODIMENT

Figure 1:
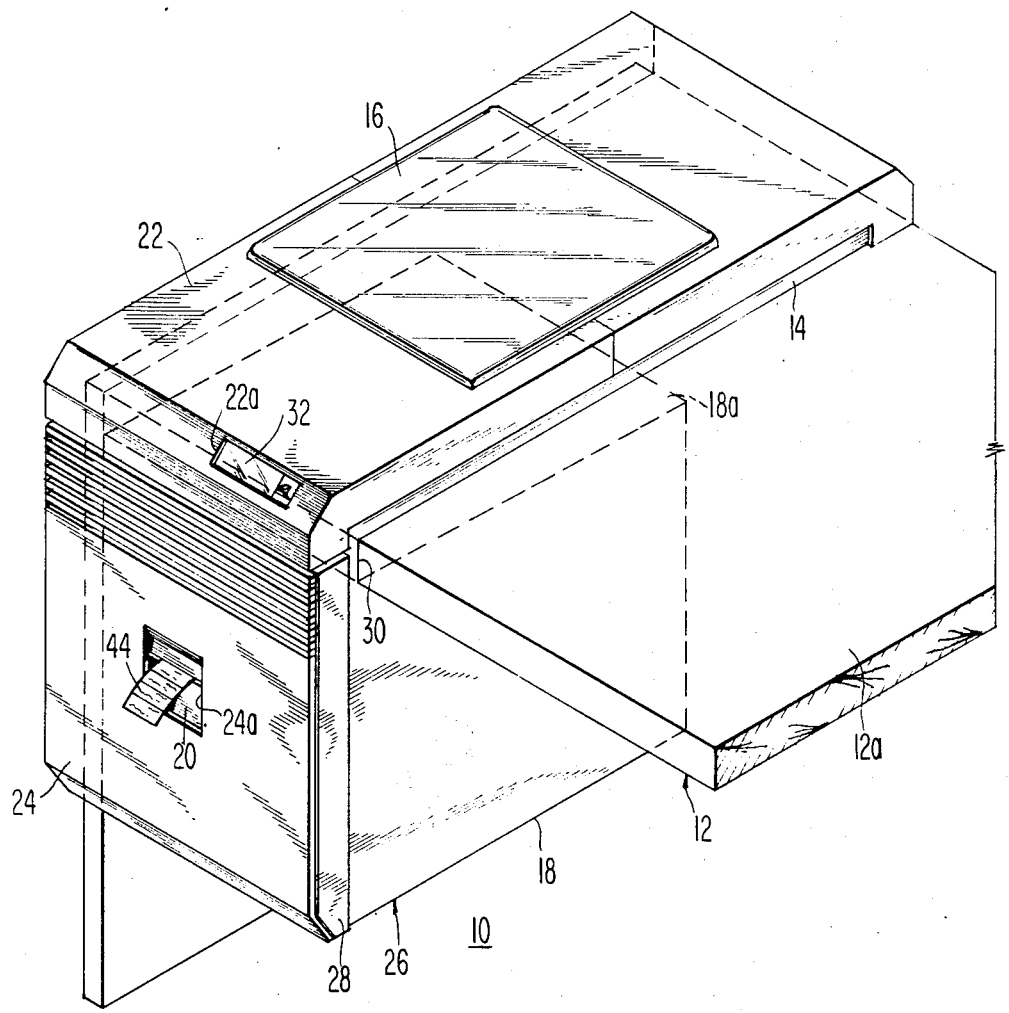
FIG. 1 is a pictorial view of a representative housing module shown in relation to a counter on which it is installed.

With reference to FIG. 1, there is illustrated a housing module 10 mounted on a counter 12. The module includes a tray-like section 14 (better seen in FIG. 2) with a load cell 16 disposed therein and a box-like enclosure 18 containing at least a meter strip printer 20. A cover 22 for section 14 and a door 24 for enclosure 18 complete the module assembly.

Figure 2:
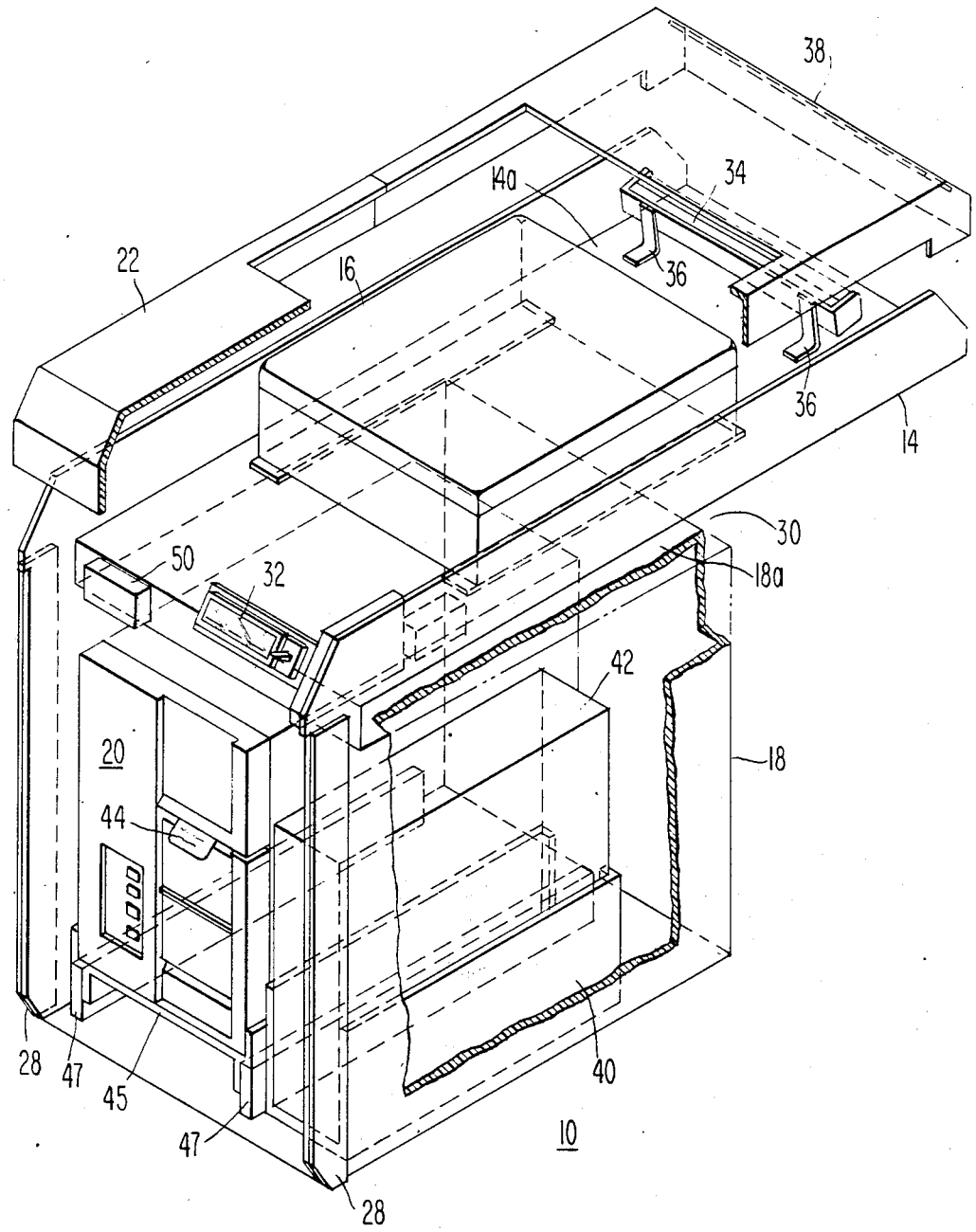
FIG. 2 is a pictorial view of the module of FIG. 1 with portions cut away to better illustrate the base structure thereof and the components housed therein.

As seen in FIGS. 1, 2, the housing module 10 includes a base structure 26. In an actual embodiment, the base structure 26 was formed of Fiberglass in a unitary fashion and includes the tray-like section 14 and the box-like enclosure 18 joined at respective corresponding extremities thereof in one above the other relation, and a pair of support members 28 common to section 14 and enclosure 18 for supporting the latter in the aforementioned relation. The bottom portion 14a of the tray-like section 14 and the top portion 18a of the box-like enclosure 18 are disposed in respective spaced-apart substantially parallel planes, such that a slot 30 is formed therebetween. As seen in FIG. 1, the slot 30, which has a predetermined width conforming to the thickness of the counter 12, permits the housing module 10 to slide onto the counter 12. Thereupon, the tray-like section 14 rests upon the counter top 12a while the box-like enclosure 18 is suspended under the counter, and is supported by members 28. An "L" bracket (not shown) may be mounted to the side of enclosure 18 opposite to its open end and to the underside of counter 12, to immobilize the module 10.

The electrical/electronic components disposed in the module of FIG. 2 are those associated with Postal Service transactions. It should be understood that the module may house components of different function and physical configuration. As seen in FIG. 2, a load cell 16 is located in the tray-like section 14 for weighing mail pieces (not shown). A digital readout of the weight appears on the display 32. The cover 22 shown in FIG. 1, includes a cut-out 22a to permit the viewing of the display 32. A fluorescent lamp 34 (FIG. 2) supported by brackets 36 illuminates a window 38 in cover 22, which provides an indication that the counter is "open".

The box-like enclosure 18, which is open at one end, is fitted with a U-shaped trough 40 to receive a central processing unit 42. Also, a printer 20 for providing a meter postage strip 44 for the mail piece weighed by the load cell 16 is mounted on a frame 45 and adapted to slide on rails 47 within enclosure 18. The printer 20 may be partially withdrawn from the enclosure 18 for routine servicing, such as the replenishment of the meter paper stock. Door 24, as seen in FIG. 1, includes an opening 24a therein for external access to the strip 44.

In the side section view of FIG. 3, it is observed that the module 10 exhibits the general configuration of the numeral "6". Such a configuration permits the module 10 to be prewired, thereby eliminating cable-through holes in the counter. Thus, A.C. power is provided from source 46 by cable 48 which enters junction box 50 and from which power is supplied via the electrical conductors 52 to the load cell 16, fluorescent lamp 34, central processing unit 42 and printer 20. Communication among the elctrical components is provided by cable 54 which may terminate in a standard electrical interface 56 permitting communication with components in other housing modules (not shown) which may be present in a system.

In conclusion, a modular housing has been described which is particularly advantageous in the mounting of a plurality of interconnected components in a crowded environment. As indicated hereinbefore, the housing is easily and quickly installed and requires no modification of the counter-like structure which supports it. Additionally, the components and their associated electrical cables are accessible and the components themselves may be readily removed and replaced. While the previous description has been concerned with a Postal Service application, it should be understood that the present invention has utility in other and different applications. Changes and modifications of the housing may be needed to suit the particular requirements of such applications. Such changes and modifications insofar as they are not departures from the true scope of the invention are intended to be covered by the following claims.

What is claimed is:

1. A housing module disposed on and under a counter-like unit comprising:
    a base structure, said base structure including a tray-like section and a box-like enclosure joined at respective corresponding extremities thereof in one above the other relation, support means common to said extremities of said tray-like section and said box-like enclosure for supporting said section and said enclosure in said one above the other relation, said tray-like section having at least a bottom and said box-like enclosure having at least a top, said bottom of said section and said top of said enclosure being disposed in substantially parallel spaced-apart planes, such that a slot is formed therebetween, whereby a counter-like unit is adapted to be accommodated within said slot when said base structure is slid onto said unit, said tray-like section and said box-like enclosure having respective open sides at said corresponding extremities, whereby a passageway is provided around the joined portions of said extremities between said section and said enclosure, and
    whereupon said section is disposed on the top of said counter-like unit and said enclosure is disposed below said unit.

2. A housing module as defined in claim 1 further including a plurality of electrical components, at least a pair of said components being disposed respectively in said tray-like section and said box-like enclosure, and electrical cable means operatively connecting the components in said section and said enclosure to each other.

3. A housing module as defined in claim 2 further characterized in that said electrical cable means is routed from said tray-like section, through said passageway, and into said box-like enclosure, thereby eliminating the need for cable through-holes in said counter-like unit.

4. A housing module as defined in claim 3 further including cover means disposed over said tray-like section.

5. A housing module as defined in claim 4 wherein said cover means is formed with a cut-out therein, whereby an electrical component disposed in said tray-like section is accessible outside said module.

6. A housing module as defined in claim 5 further including door means mounted adjacent said support means for selectively enclosing said open side of said box-like enclosure, said passageway between said section and said enclosure being unobstructed by said door means.

7. A housing module as defined in claim 6 wherein said door means is formed with a cut-out therein, whereby an electrical component disposed in said box-like enclosure is accessible outside said module.

8. A housing module as defined in claim 7 wherein said tray-like section includes lamp means mounted therein, said cover means having a window disposed in proximity to said lamp means.

9. A housing module as defined in claim 8 wherein said box-like enclosure includes means for slidably mounting said electrical component disposed therein, whereby said electrical component may be slid at least partially out of said enclosure through said open side.

10. A housing module as defined in claim 9 characterized in that said base structure is of unitary construction.

* * * * *